United States Patent
Xie et al.

(10) Patent No.: US 9,780,197 B1
(45) Date of Patent: Oct. 3, 2017

(54) METHOD OF CONTROLLING VFET CHANNEL LENGTH

(71) Applicant: GLOBALFOUNDRIES INC., Grand Cayman (KY)

(72) Inventors: Ruilong Xie, Schenectady, NY (US); Min Gyu Sung, Latham, NY (US); Chanro Park, Clifton Park, NY (US); Hoon Kim, Horseheads, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/378,596

(22) Filed: Dec. 14, 2016

(51) Int. Cl.
*H01L 29/66* (2006.01)
*H01L 29/786* (2006.01)
*H01L 29/423* (2006.01)
*H01L 29/51* (2006.01)
*H01L 29/49* (2006.01)
*H01L 21/28* (2006.01)

(52) U.S. Cl.
CPC .. *H01L 29/66666* (2013.01); *H01L 21/28088* (2013.01); *H01L 29/42392* (2013.01); *H01L 29/4966* (2013.01); *H01L 29/517* (2013.01); *H01L 29/66553* (2013.01); *H01L 29/78642* (2013.01)

(58) Field of Classification Search
CPC ......... H01L 29/66666; H01L 21/28088; H01L 29/42392; H01L 29/4966; H01L 29/517; H01L 29/66553; H01L 29/78642
See application file for complete search history.

(56) References Cited

U.S. PATENT DOCUMENTS

| | | |
|---|---|---|
| 9,018,711 B1 | 4/2015 | Cai et al. |
| 9,245,885 B1 | 1/2016 | Xie et al. |
| 9,368,572 B1 * | 6/2016 | Cheng ................. H01L 29/7827 |

* cited by examiner

*Primary Examiner* — Karen Kusumakar
(74) *Attorney, Agent, or Firm* — Gibb & Riley, LLC; Francois Pagette

(57) ABSTRACT

Methods for making a vertical transistor and controlling channel length. A fin is formed over a semiconductor substrate. A bottom source/drain region is formed below the fin. A bottom spacer is formed above the source/drain region. A first sacrificial layer is formed around the fin. A second sacrificial layer is formed around the first sacrificial layer. A portion of the first sacrificial layer is removed to create a recess between sidewalls of the second sacrificial layer. A nitride material is deposited into the recess. The second sacrificial layer and remaining portions of the first sacrificial layer are removed. A dielectric layer is deposited on the nitride material and exposed portions of the fin. A gate electrode is formed over sidewalls of the fin.

20 Claims, 20 Drawing Sheets

METHOD OF CONTROLLING VFET CHANNEL LENGTH

BACKGROUND

The present disclosure relates to semiconductors and, more particularly, to methods for forming a vertical field effect transistor (VFET) and controlling the channel length.

Field effect transistors (FETs) are typically formed on semiconductor substrates and include a channel region disposed between source and drain regions, and a gate configured to electrically connect the source and drain regions through the channel region. Structures where the channel region is parallel to the main surface of the substrate are referred to as horizontal FET structures, while structures where the channel region is perpendicular to the main surface of the substrate are referred to as vertical FETS (VFETs). Thus, in a VFET device the direction of the current flow between the source and drain regions is normal to the main surface of the substrate.

A typical VFET device includes a vertical fin that extends upward from the substrate. The fin forms the channel region of the transistor. A source region and a drain region are situated in electrical contact with the top and bottom ends of the channel region, while the gate is disposed on one or more of the fin sidewalls.

In other words, when viewing a VFET device from above, the channel region of the device is positioned vertically below one of the source/drain regions while the other source/drain region is positioned vertically below the channel region, i.e., the channel region is positioned vertically between a lower source/drain region and an upper source/drain region. In the architecture for a VFET, the contacted gate pitch may be decoupled from the gate length.

SUMMARY

Current VFET schemes use recessing of the gate dielectrics and metal gate metal to define the channel length. The gate dielectrics can be $SiO_2$, SiOn, $HfO_2$, or $ZrO_2$. The metal gate consists of WFM (work function metals) such as TiN, TiAl, TiC, TaN, and lower conductance metals such as W or Co. However, various conditions, such as C/E non-uniformity, iso-dense etch loading, macro-to-macro variations, etch rate drift, etc. can lead to gate length variation. If the VFETs use different WFM for multiple threshold voltages (Vt) (e.g., NFETs and PFETs need different WFM to achieve appropriate Vt), the variation could be even worse. There remains a need for a method of controlling VFET channel length. Accordingly, a process flow has been developed for forming VFET devices, which is efficient and may be incorporated in a mass production manufacturing environment, and that controls VFET channel length.

According to exemplary methods of making a vertical transistor, a fin is formed over a semiconductor substrate. A bottom source/drain region is formed below the fin. A bottom spacer is formed above the bottom source/drain region. A first sacrificial layer is formed around the fin. A second sacrificial layer is formed around the first sacrificial layer. A portion of the first sacrificial layer is removed to create a recess between sidewalls of the second sacrificial layer. A nitride material is deposited into the recess. The second sacrificial layer and remaining portions of the first sacrificial layer are removed. A dielectric layer is deposited on the nitride material and exposed portions of the fin. A gate electrode is formed over sidewalls of the fin.

According to other exemplary methods, a fin is formed on a top surface of a substrate. The fin has a height above the top surface of the substrate. The fin includes a semiconductor section connected to the substrate, an oxide section above the semiconductor section, and a hardmask section above the oxide section. A portion of the substrate, below the fin, includes a source/drain region for a vertical field effect transistor (VFET). A bottom spacer is formed above the source/drain region. An oxide liner is deposited on the fin. A first sacrificial layer is formed around the fin. The first sacrificial layer is made of a conformal layer of amorphous silicon. A second sacrificial layer is formed around the first sacrificial layer. The oxide section and hardmask section of the fin are removed using an isotropic etch. A recess is created between sidewalls of the second sacrificial layer using an isotropic etch of the first sacrificial layer. A nitride cap is deposited into the recess. The second sacrificial layer and remaining portions of the first sacrificial layer are removed. A dielectric layer is deposited on the nitride cap and exposed portions of the fin. A gate electrode is formed over sidewalls of the fin using a work function metal.

According to exemplary methods herein, a substrate of semiconductor material is provided, with the substrate having a top surface. A fin is formed on the substrate. The fin has a height above the top surface of the substrate. The fin includes a bottom semiconductor section, an oxide section above the bottom semiconductor section, and a hardmask section above the oxide section. A portion of the substrate, below the fin, includes a source/drain region for a vertical field effect transistor (VFET). According to the method, a spacer layer is formed on the top surface of the substrate. An oxide liner is deposited on the fin and the spacer layer. A conformal layer of amorphous silicon is deposited on the oxide liner. Areas around the fin are filled with an oxide layer. The oxide layer is planarized to expose a top surface of the conformal layer of amorphous silicon. A recess is formed in the conformal layer of amorphous silicon to expose the fin. The oxide liner on a top surface of the fin is removed. The hardmask section of the fin is removed. Exposed portions of the oxide liner are removed. Exposed portions of the conformal layer of amorphous silicon are etched to a level of the oxide section of the fin. A nitride cap is deposited on exposed portions of the conformal layer of amorphous silicon and the oxide section of the fin. The oxide layer is removed. The conformal layer of amorphous silicon and remaining portions of the oxide liner on the fin are removed. A dielectric layer is deposited on the nitride cap, exposed portions of the fin, and the spacer layer on the top surface of the substrate. A work function metal is deposited on the dielectric layer. Using the dielectric layer as a mask, the work function metal is etched. Exposed portions of the dielectric layer are removed.

BRIEF DESCRIPTION OF THE DRAWINGS

The foregoing and other exemplary purposes, aspects, and advantages will be better understood from the following detailed description of exemplary methods herein with reference to the drawings, in which.

DETAILED DESCRIPTION

Figure 1:
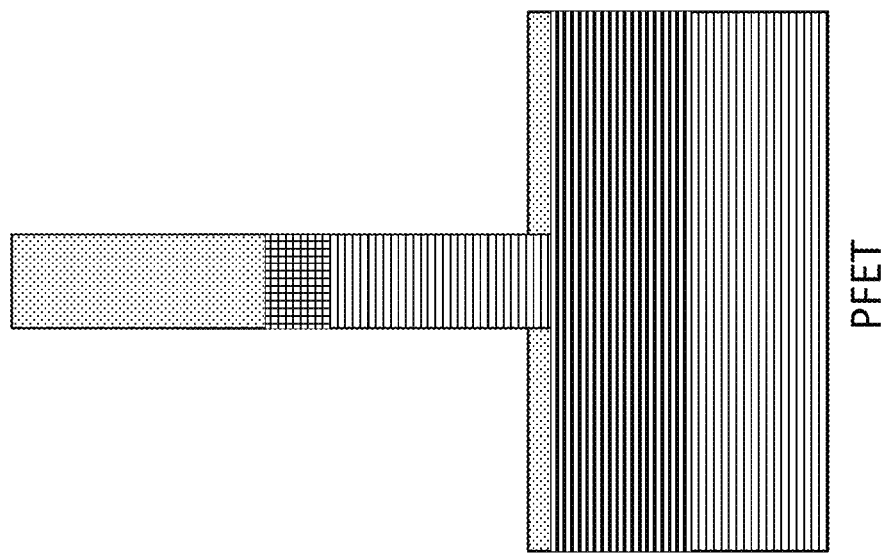
FIGS. 1-18 are schematic diagrams of a sectional view of semiconductor structure in fabricating a VFET structure according to methods herein.
Figure 1:
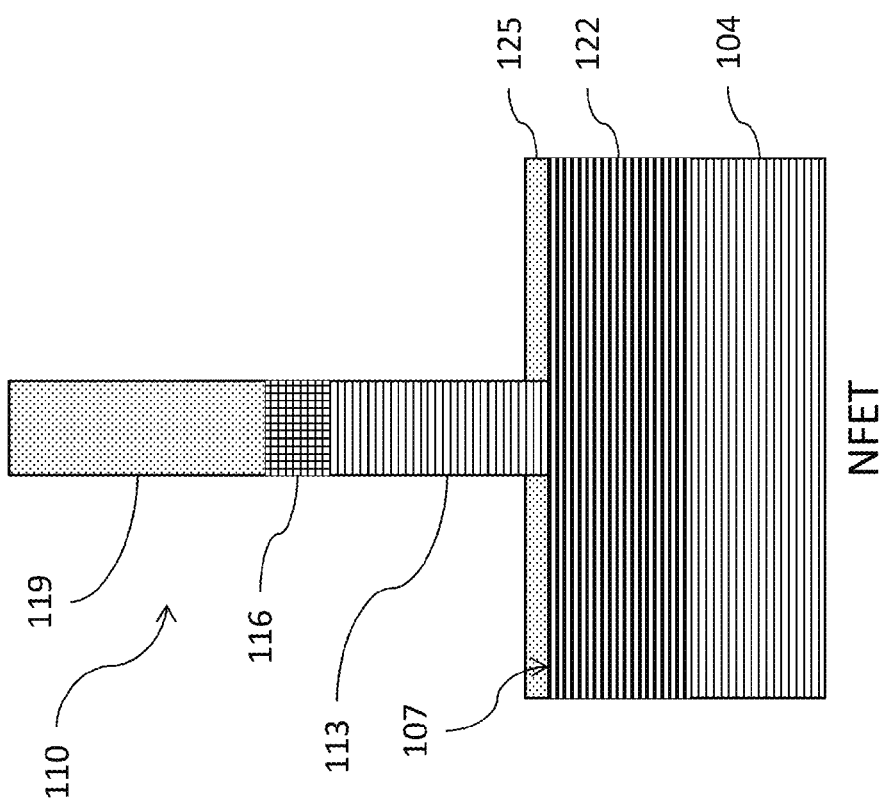

Referring now to the drawings, there are shown exemplary illustrations of the structures of a vertical fin field effect transistor (VFET) in a semiconductor wafer and the method of forming such structure.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can include, for example, ion implantation, etc.

Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator). The current/voltage within the gate changes the conductivity of the channel region of the transistor.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can include any material appropriate for the given purpose (whether now known or developed in the future) and can include, for example, Si, SiC, SiGe, SiGeC, other III-V or II-VI compound semiconductors, or organic semiconductor structures, etc. The "shallow trench isolation" (STI) structures are well-known to those ordinarily skilled in the art and are generally formed by patterning openings/trenches within the substrate and growing or filling the openings with a highly insulating material (this allows different active areas of the substrate to be electrically isolated from one another).

According to methods herein, a novel combination of elements can be used to enable a vertical FinFET. The method described below provides specific steps to shape the VFET and control the channel length.

Referring to the drawings, FIGS. 1-18 illustrate the processing steps that can be used in fabricating a VFET structure according to methods herein. As shown in FIG. 1, the VFET may be fabricated on a substrate 104 having a top surface 107. The VFET includes a fin, indicated generally as 110, attached to the top surface 107 and in a vertical position relative to the top surface 107. As is known in the art, the fin 110 may be formed by conventional patterning techniques, such as SADP (self-aligned double patterning) or SAQP (self-aligned quadruple patterning). The fin 110 is segregated into multiple sections, such as a semiconductor section 113 connected to the substrate 104, an oxide section 116 above the semiconductor section 113, and a hardmask section 119 above the oxide section 116. The hardmask section 119 can be formed of any suitable material, whether now known or developed in the future, such as a metal or organic or inorganic (SiN, $Si_3N_4$, SiC, $SiO_2C$ (diamond)) hardmask, that has etch resistance greater than the substrate and insulator materials used in the remainder of the structure.

The substrate 104 includes a bottom source/drain region 122 for the vertical field effect transistor (VFET). The bottom source/drain region 122 may be formed by doping a portion of the substrate 104. By "doping" is meant intentionally introducing impurities into a pure semiconductor for the purpose of modulating its electrical properties. In particular, according to methods herein, the doping may be accomplished with a p-type impurity species, such as boron, to render the bottom source/drain region 122 p-type in which holes are the majority carriers and dominate the electrical conductivity of the constituent semiconductor material. Alternatively, the doping may be accomplished with an n-type impurity species, such as arsenic to render the bottom source/drain region 122 n-type in which electrons are the majority carriers and dominate the electrical conductivity of the semiconductor material.

As shown in FIG. 1, a spacer layer 125, also referred to as a bottom spacer, may be formed on the top surface 107 of the substrate 104. The spacer layer 125 may be a nitride layer and may be formed by directional dielectric deposition, such as gas cluster ion beam deposition (GCIB) or high density plasma (HDP) deposition.

Figure 2:
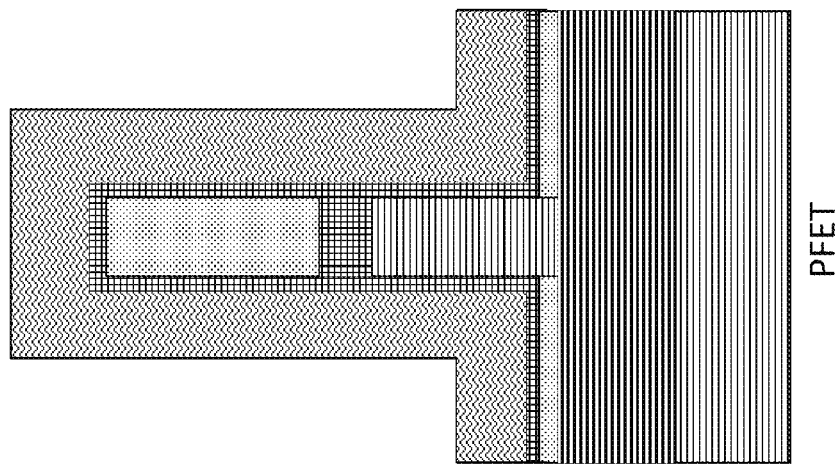
Figure 2:
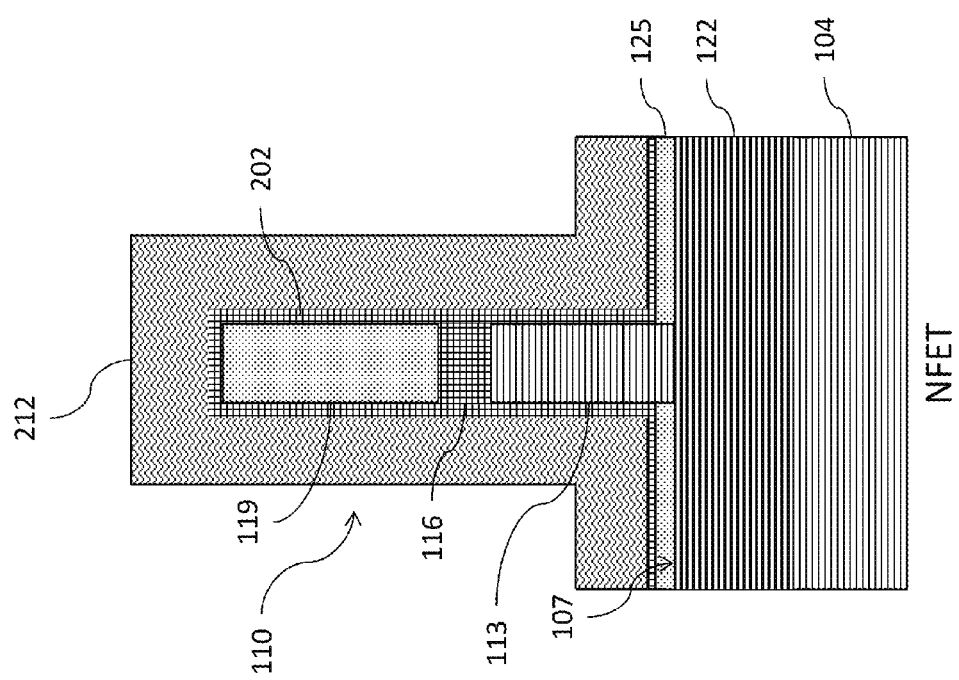

In FIG. 2, an oxide liner 202 is deposited on the fin 110 and the spacer layer 125. Further, a first sacrificial layer 212 is formed around the fin 110. The first sacrificial layer 212 may include a conformal layer of amorphous silicon.

Figure 3:
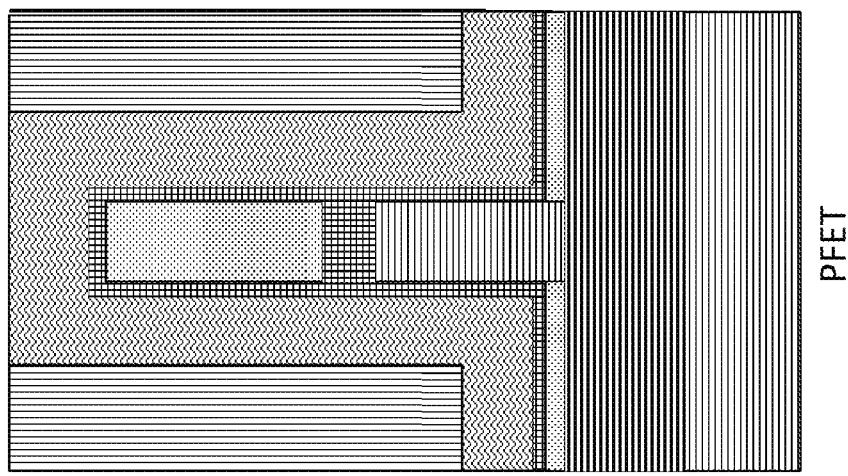
Figure 3:
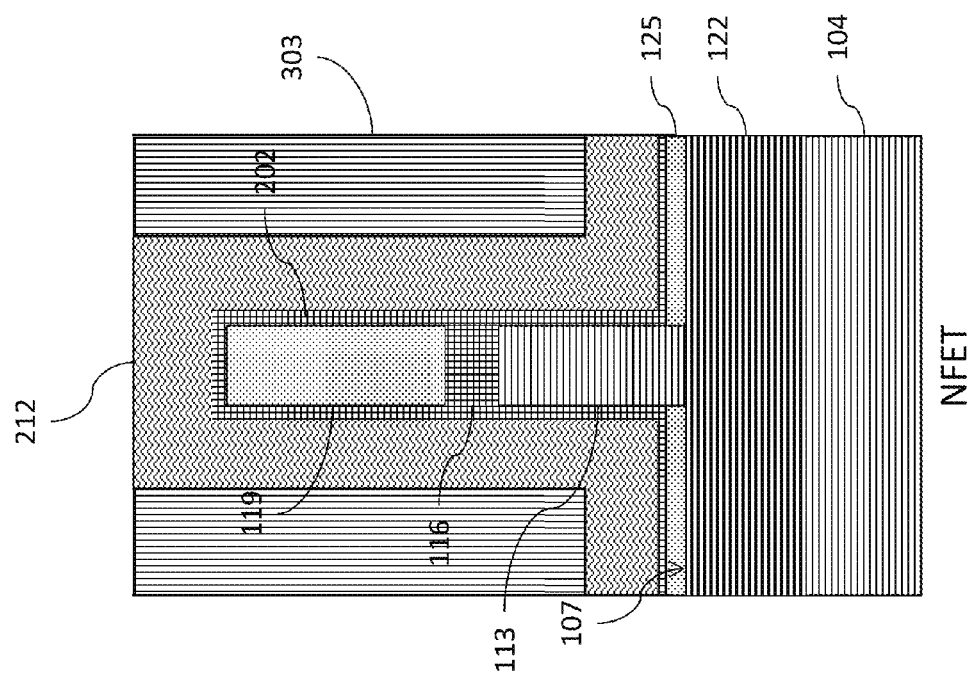

In FIG. 3, a second sacrificial layer 303 is formed around the first sacrificial layer 212. The second sacrificial layer 303 may be formed by filling areas around the fin 110 with an oxide layer. The oxide layer and top portion of the conformal layer of amorphous silicon may be cleaned and polished using a CMP (chemical-mechanical polishing) process. The CMP process combines abrasion and dissolution to remove excess material from the top surface of the oxide layer and conformal layer of amorphous silicon. The details regarding CMP processing are not set forth herein, in order to allow the reader to focus on the salient aspects of the disclosed process.

Figure 4:
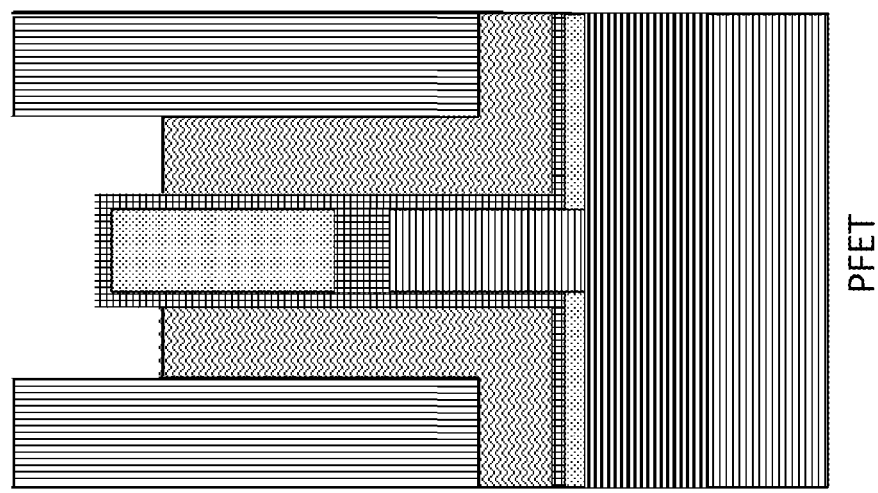
Figure 4:
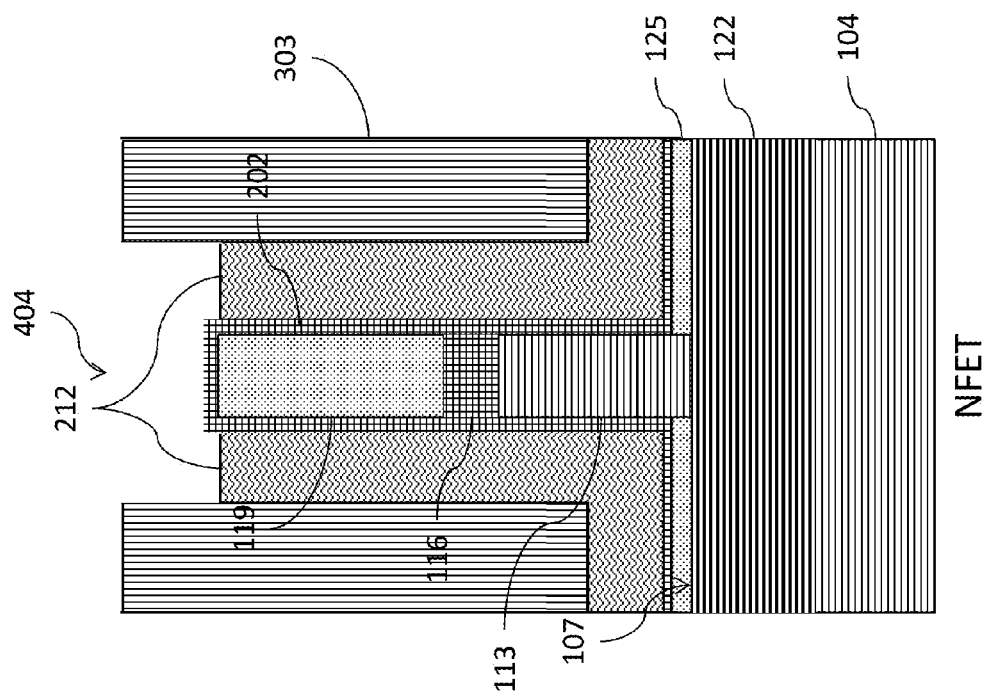

In FIG. 4, etching is performed on the first sacrificial layer 212 forming a recess 404 in the conformal layer of amorphous silicon to expose portions of the fin 110. The etching may include reactive ion etch (RIE), although other material removal processes can be used. As would be known by one of ordinary skill in the art, this etch process may be performed without any mask by relying on the etching selectivity between the amorphous silicon of the first sacrificial layer 212 and the oxide of the second sacrificial layer 303. As shown in FIG. 4, due to etch loading effect or other variation factors like C-E non-uniformity, there can be variation in depth of the recess 404 depending on the location of the device on the substrate 104.

Figure 5:
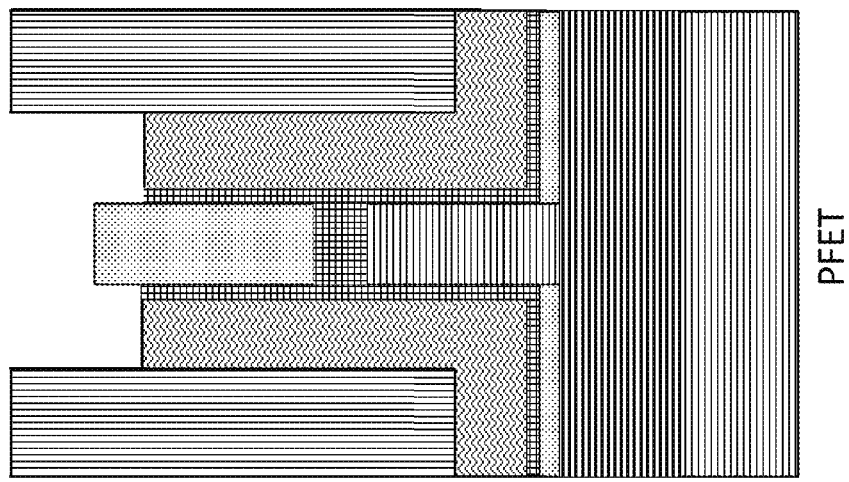
Figure 5:
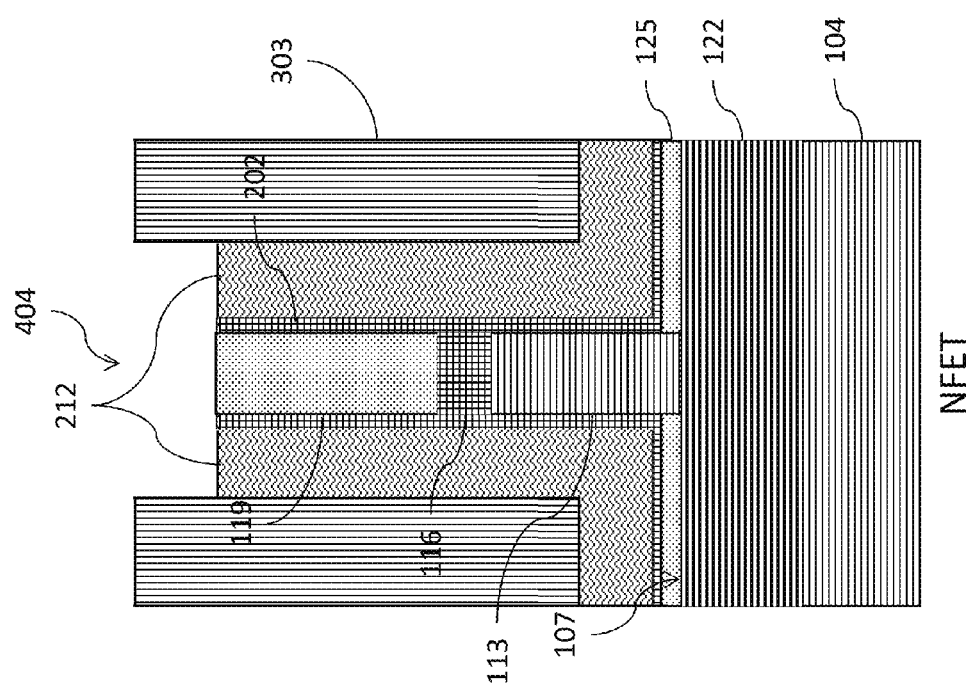

In FIG. 5, the oxide liner 202 is removed from the top surface of the fin 110 and from any exposed portions of the fin 110.

Figure 6:
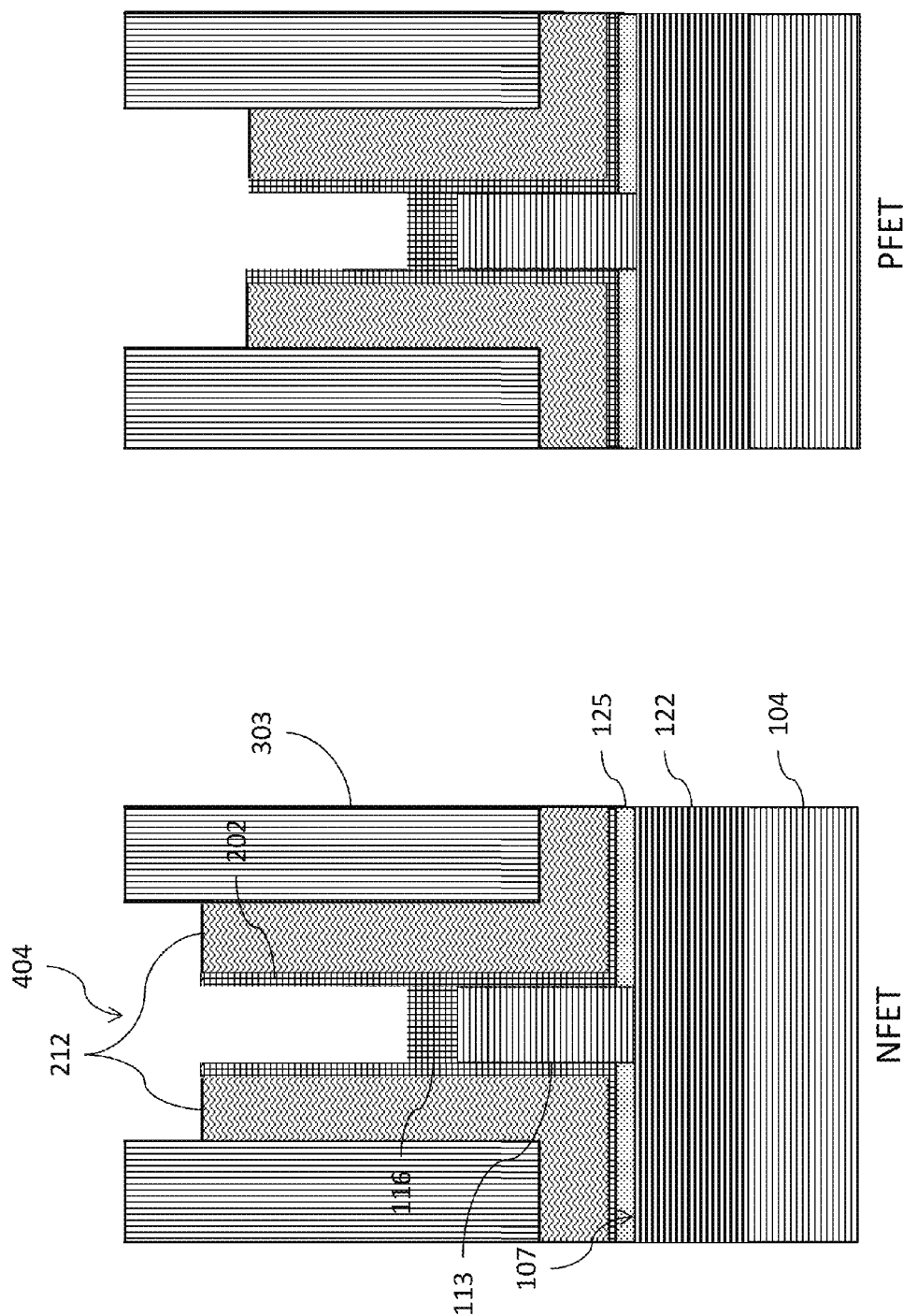

In FIG. 6, the hardmask section 119 of the fin is removed. Any suitable material removal process, such as reactive ion etching (RIE), plasma etching, wet etch, etc., can be used.

Figure 7:
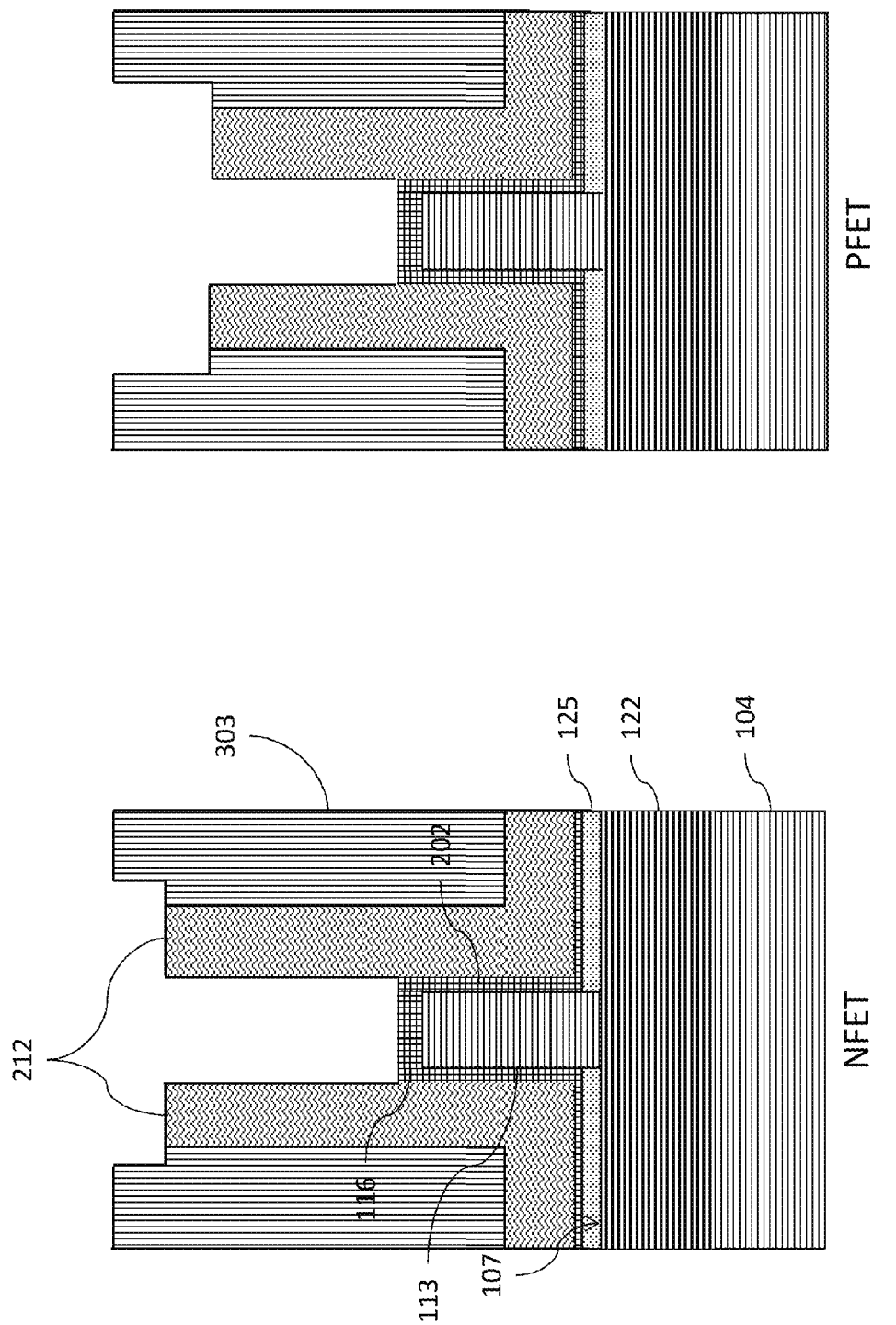

In FIG. 7, exposed portions of the oxide liner 202 are removed using an isotropic etch. The isotropic etching etches horizontally as well as vertically to remove the exposed portions of the oxide liner 202.

Figure 8:
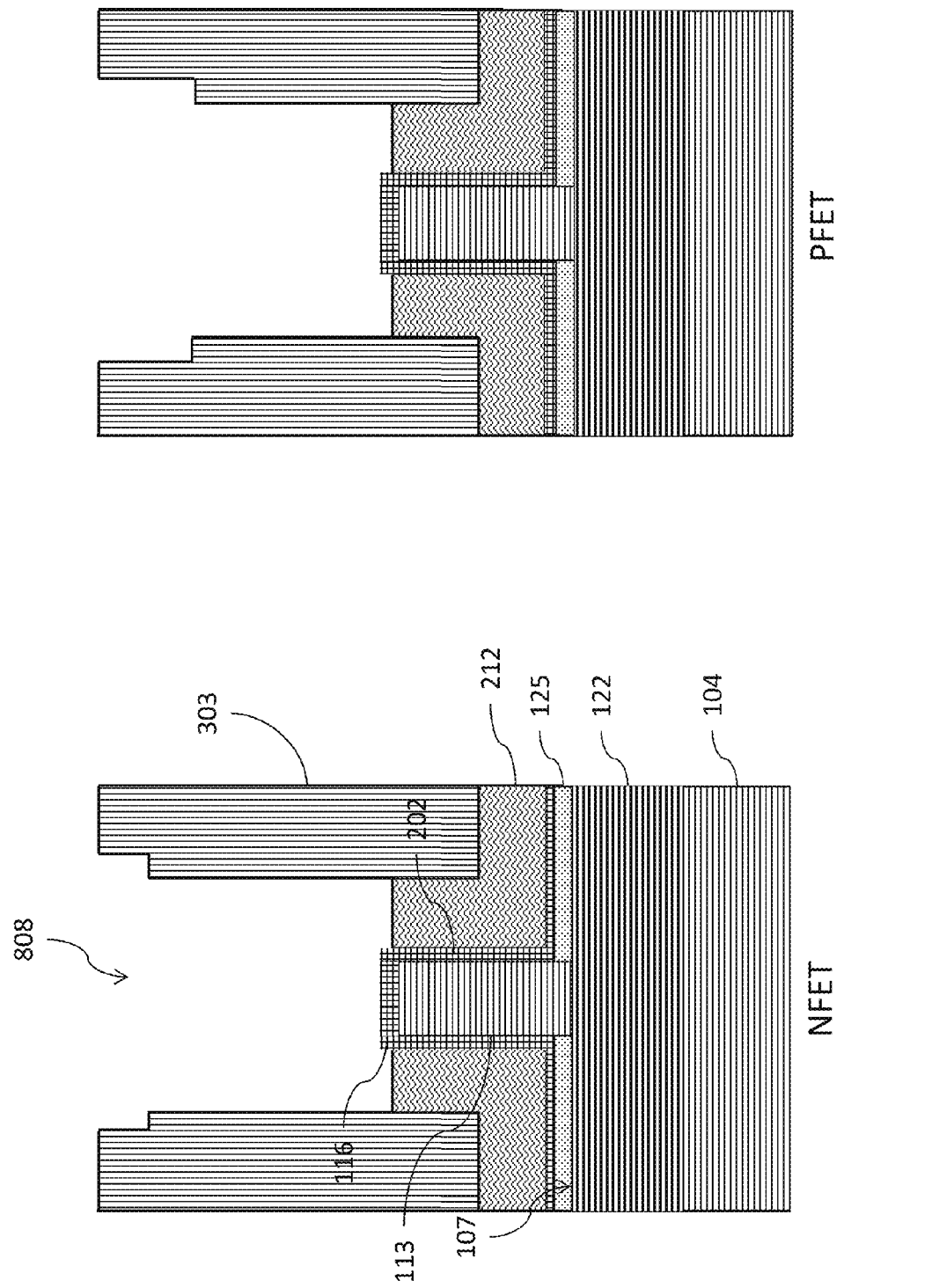

In FIG. 8, a recess 808 is created between sidewalls of the second sacrificial layer 303 (oxide layer) using an isotropic etch of the first sacrificial layer 212 (the conformal layer of amorphous silicon). Note, in FIG. 8, etching providing selective removal of the exposed portions of the conformal layer of amorphous silicon is performed to the same height. Furthermore, there may be a height variation in the material of the first sacrificial layer 212, as shown in FIG. 7; however, the thickness of the first sacrificial layer 212 is relatively uniform because it is deposited by a conformal deposition process, and the thickness is much smaller than the height. After an isotropic etch, which is targeted to remove the material of the first sacrificial layer 212 from all directions with a removal budget slightly greater than the initial thickness, the remaining height of the first sacrificial layer 212 would be very uniform across the wafer, despite the height variation in the material of the first sacrificial layer 212 in the beginning.

Figure 9:
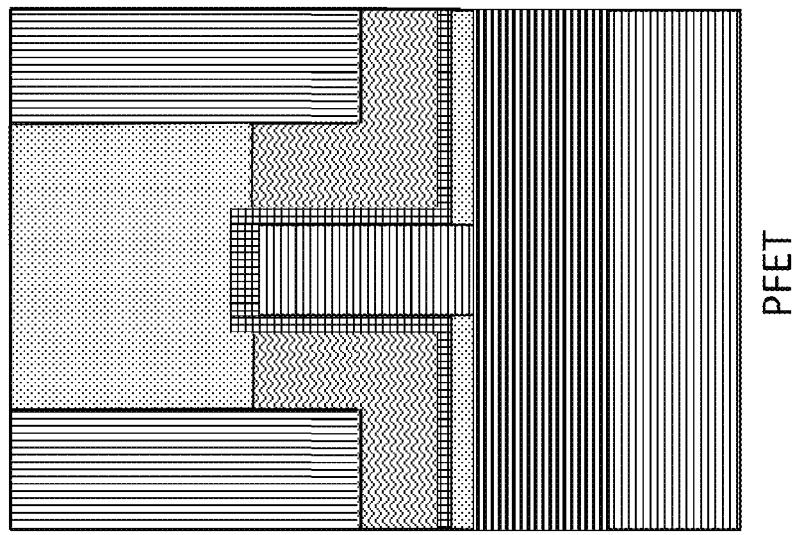
Figure 9:
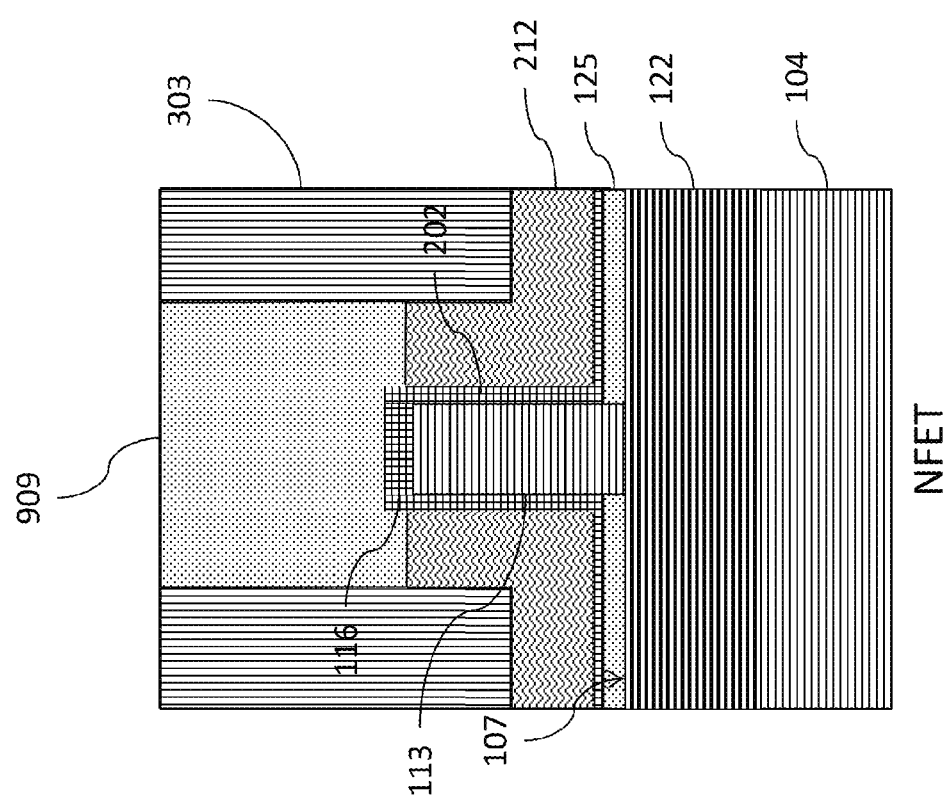

In FIG. 9, a nitride cap 909 is deposited into the recess 808 formed between sidewalls of the second sacrificial layer 303 (oxide layer). The nitride cap 909 may be formed using a nitride overfill and CMP process.

Figure 10:
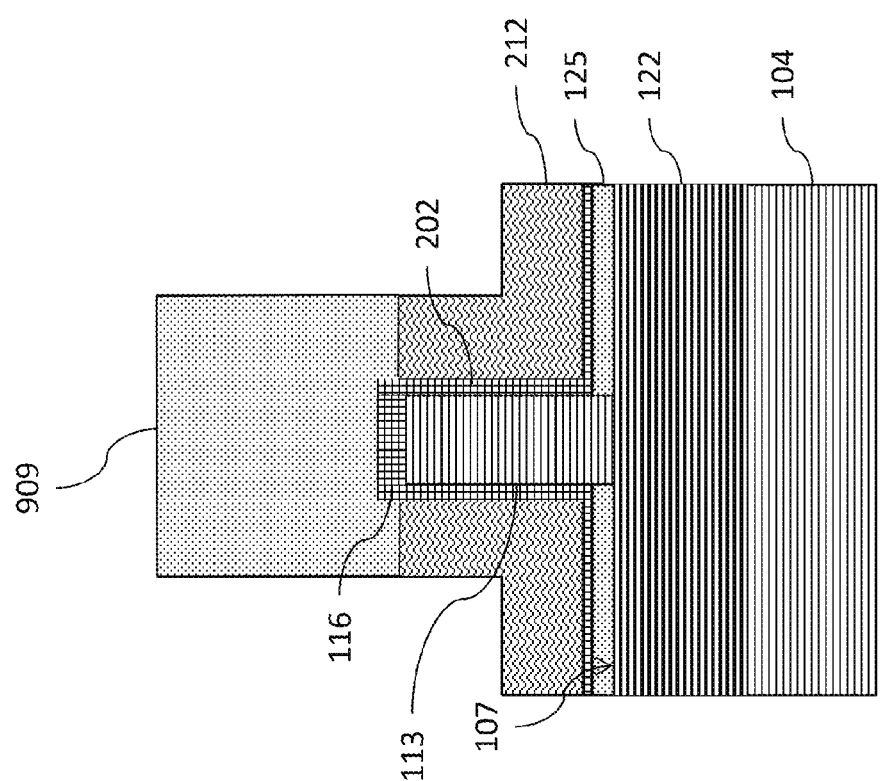

In FIG. 10, the second sacrificial layer 303 (oxide layer) is removed by using the nitride cap 909 as a mask to protect portions of the structure. The second sacrificial layer 303 (oxide layer) may be removed using a buffered hydrogen fluoride (BHF) solution.

Figure 11:
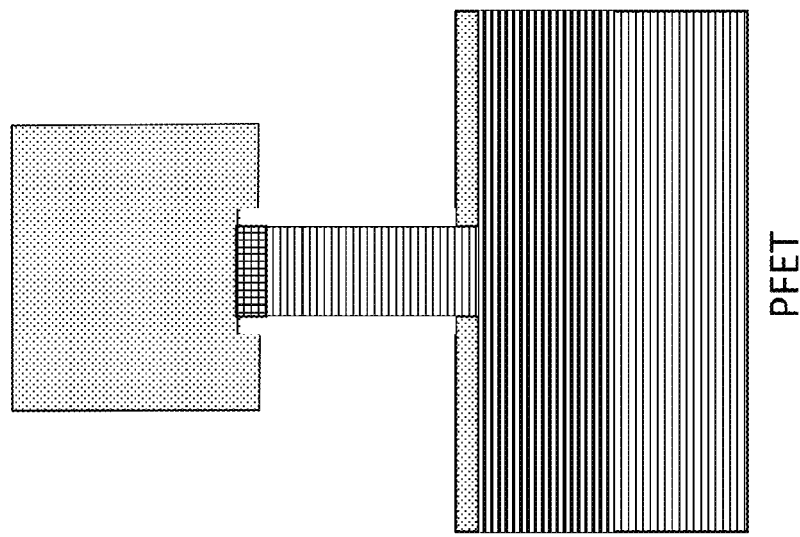
Figure 11:
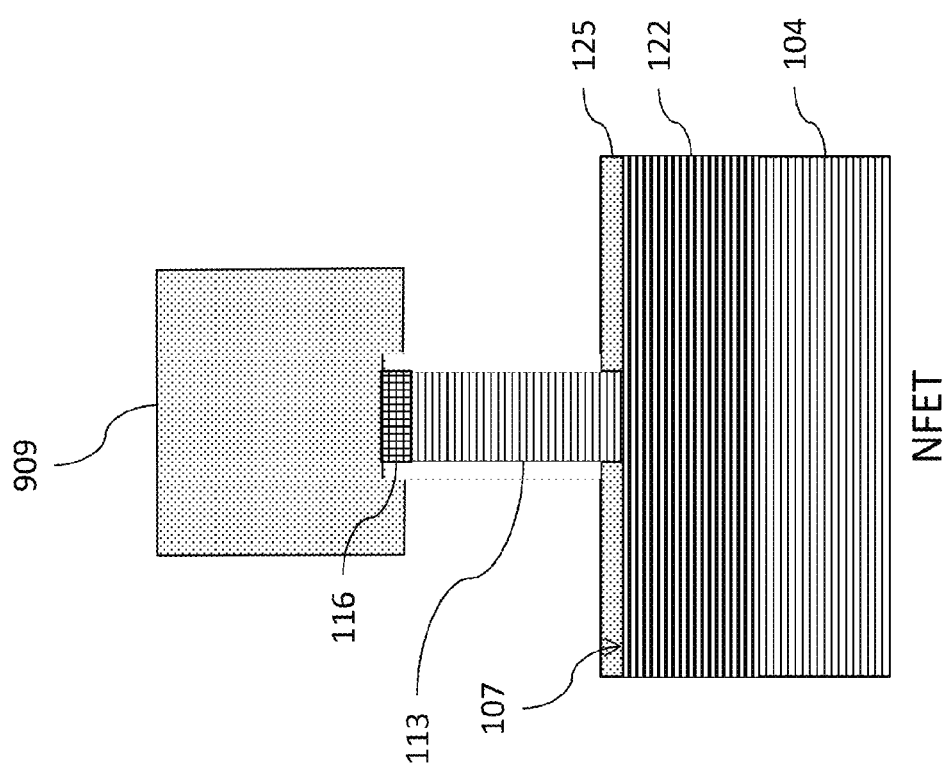

In FIG. 11, the remaining portions of the first sacrificial layer 212 (conformal layer of amorphous silicon) and remaining portions of the oxide liner 202 on the fin 110 and the spacer layer 125 (bottom spacer) may be removed by an appropriate material removal process.

Figure 12:
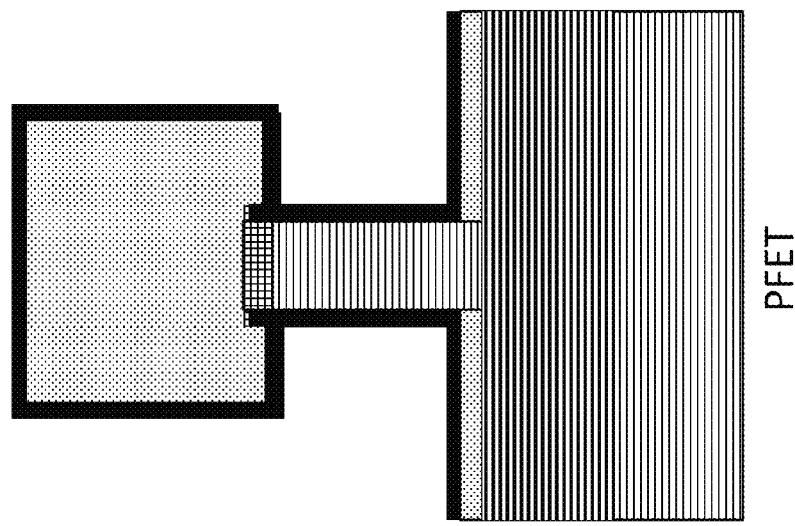
Figure 12:
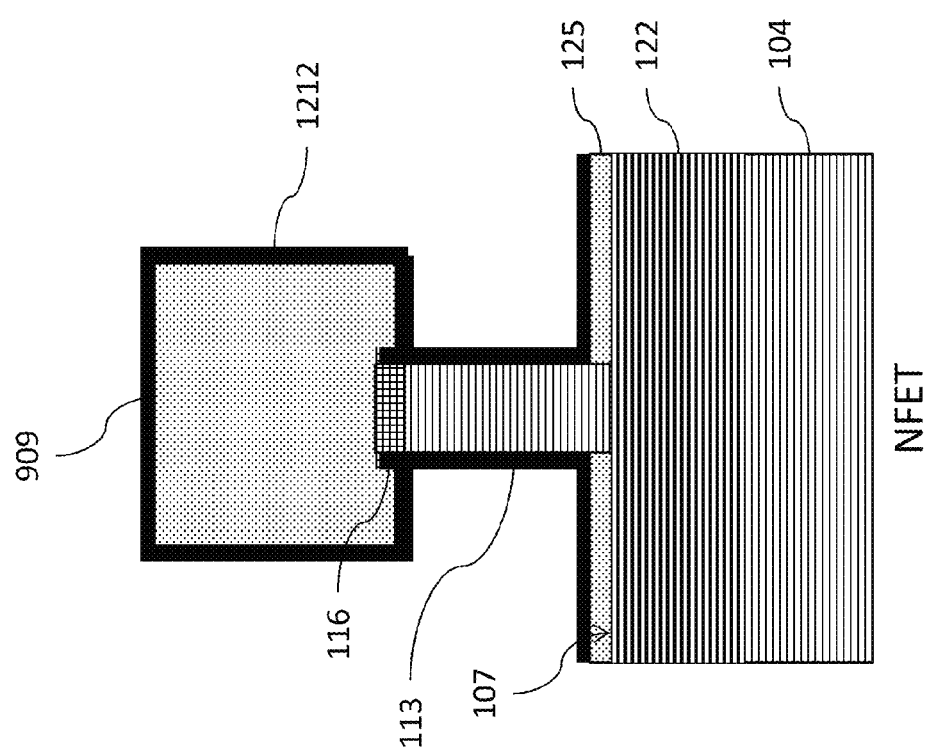

In FIG. 12, a dielectric layer 1212 is deposited on the nitride cap 909 and exposed portions of the fin 110 and the spacer layer 125 (bottom spacer). The dielectric layer 1212 may be made of hafnium oxide ($HfO_2$) or other appropriate insulator. For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a stack of $SiO_2$ and $Si_3N_4$, and metal oxides like tantalum oxide. The dielectric constant of $HfO_2$ is 4 to 6 times higher than that of $SiO_2$. The thickness of dielectrics herein may vary contingent upon the required device performance.

Figure 13:
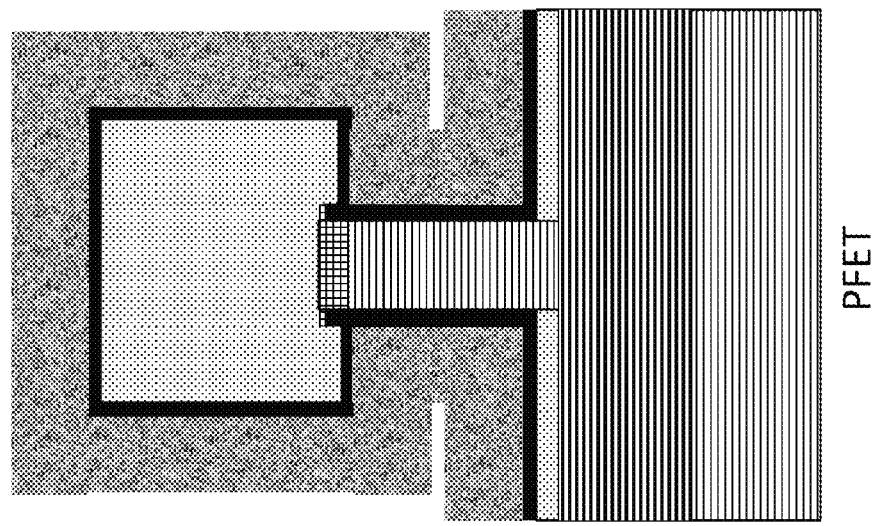
Figure 13:
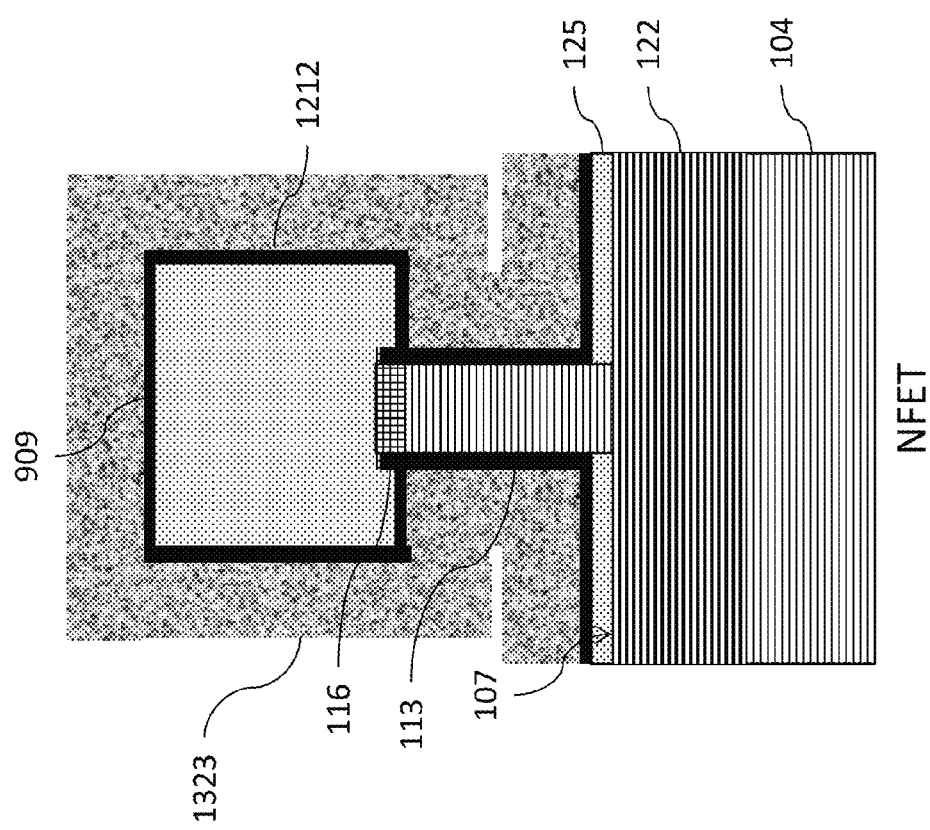
Figure 14:
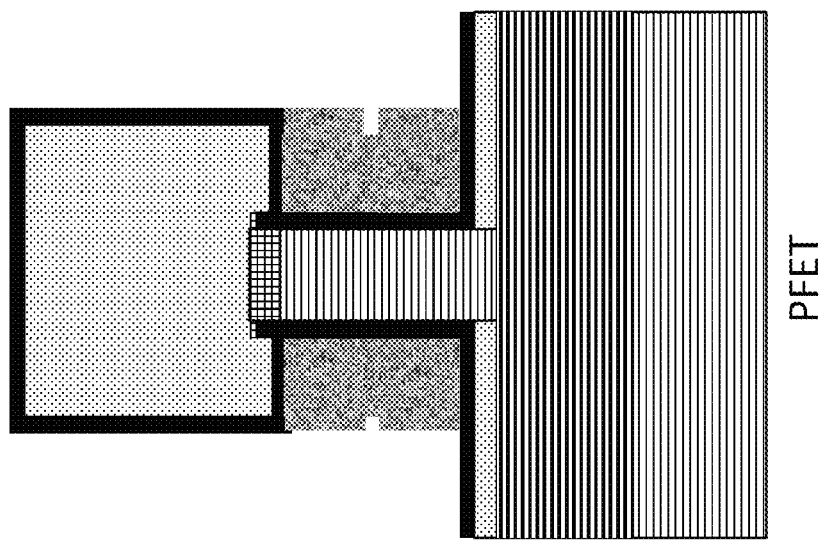
Figure 14:
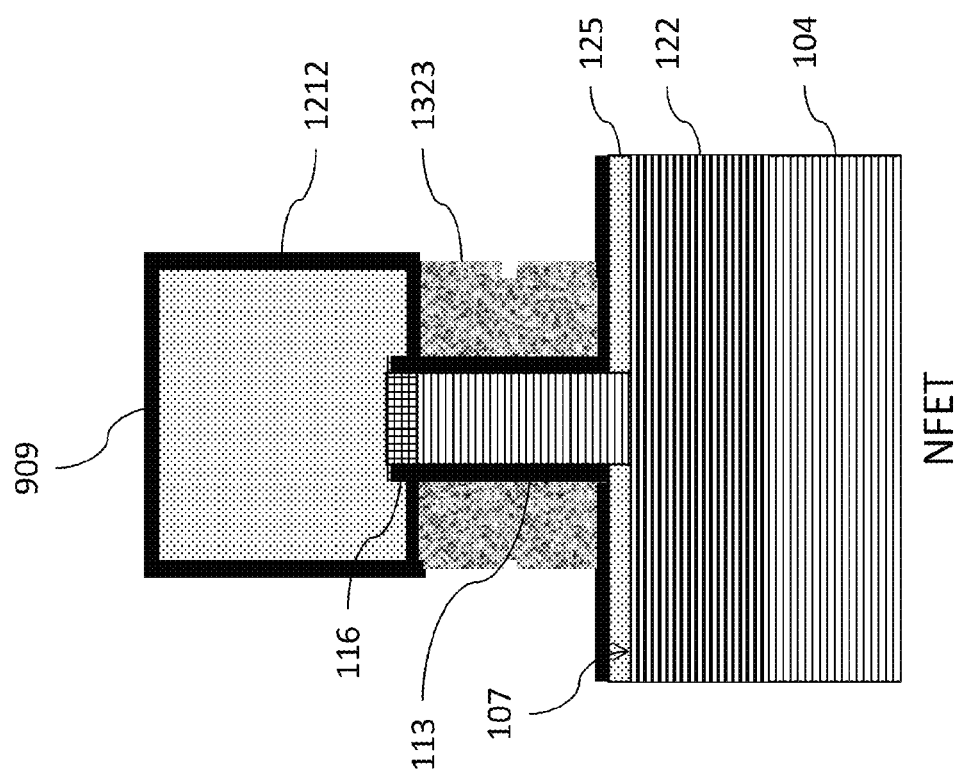
Figure 15:
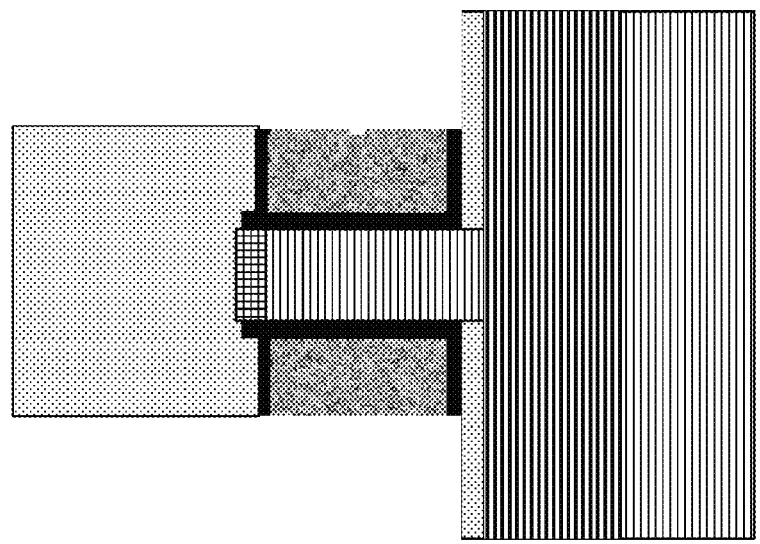
Figure 15:
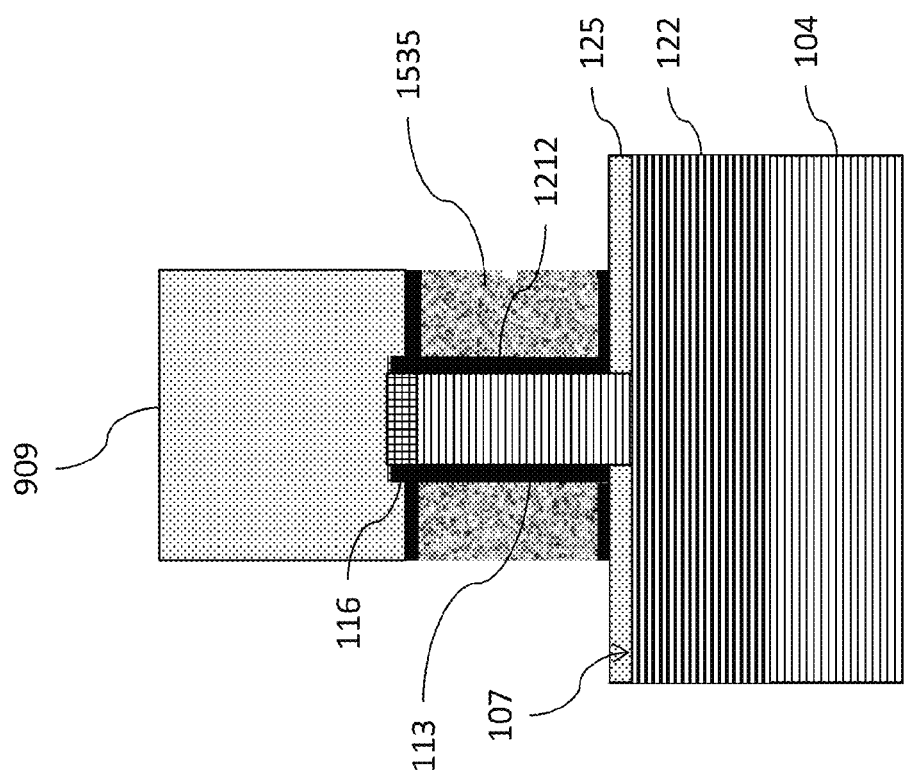

In FIG. 13, a gate metal 1323 is deposited on the dielectric layer 1212. The gate metal 1323 may consist of an appropriate work function metal such as TiN, TaN, TiC, TiAl, and conductive metals such as W. Note that in order to achieve different Vt for different devices, the metal gate composition could be different. In FIG. 13, the NFET and PFET versions of VFETs have different gate metal materials. In FIG. 14, the gate metal 1323 is etched using the dielectric layer 1212 as a mask. Using $HfO_2$ as the dielectric layer 1212 protects the nitride cap 909 from erosion. In FIG. 15, exposed portions of the dielectric layer 1212 are removed. As shown in FIG. 15, the gate electrode 1535 is formed while controlling the gate length, even with use of different work function metals.

Figure 16:
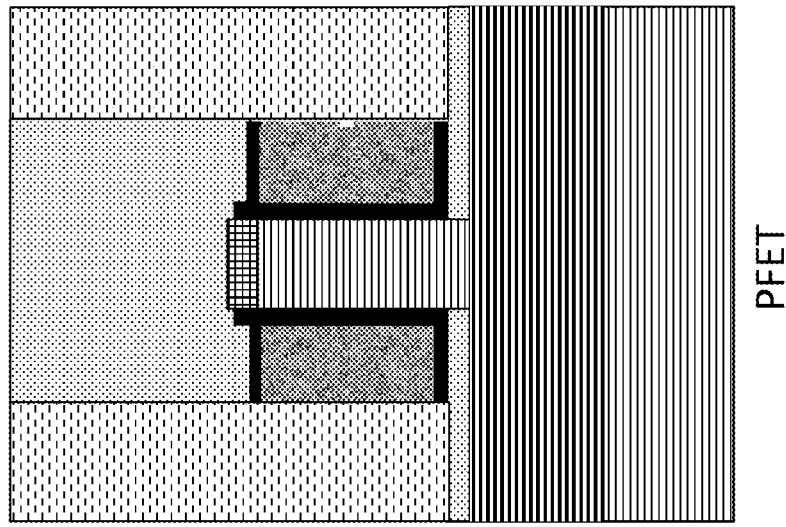
Figure 16:
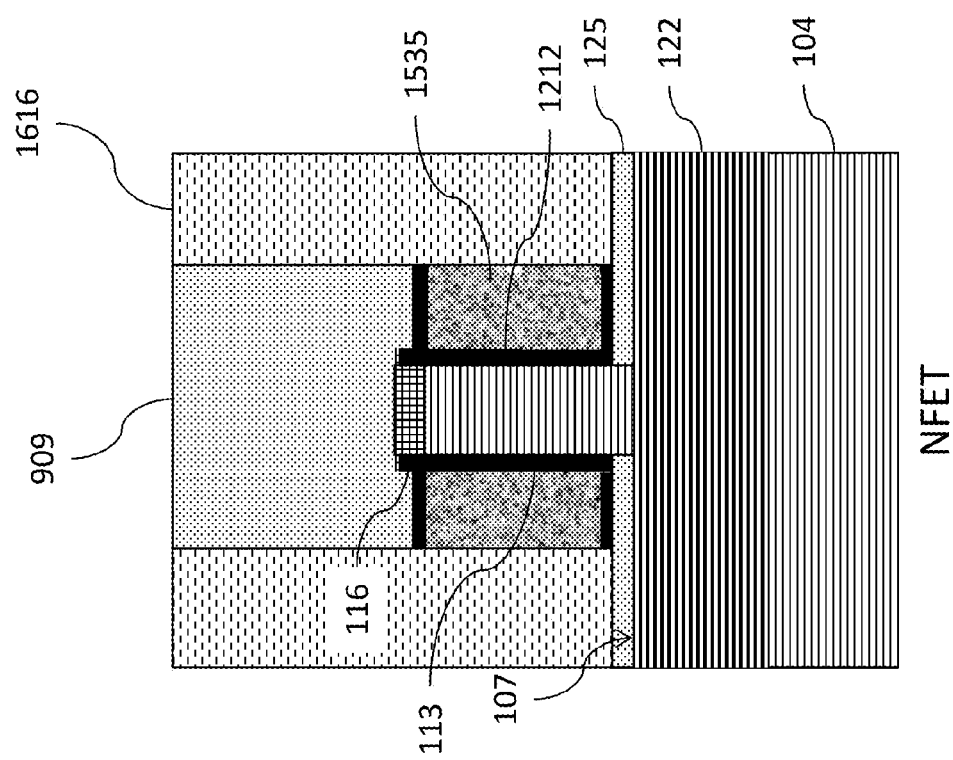
Figure 17:
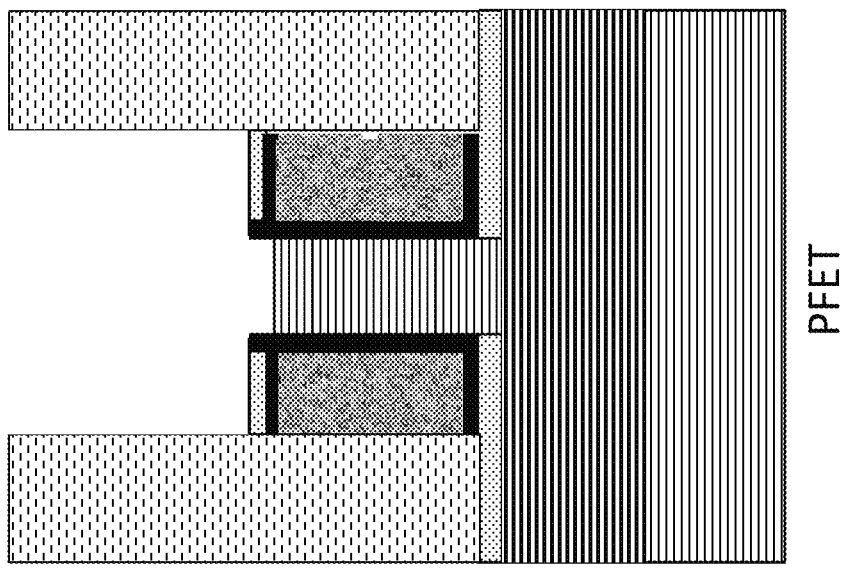
Figure 17:
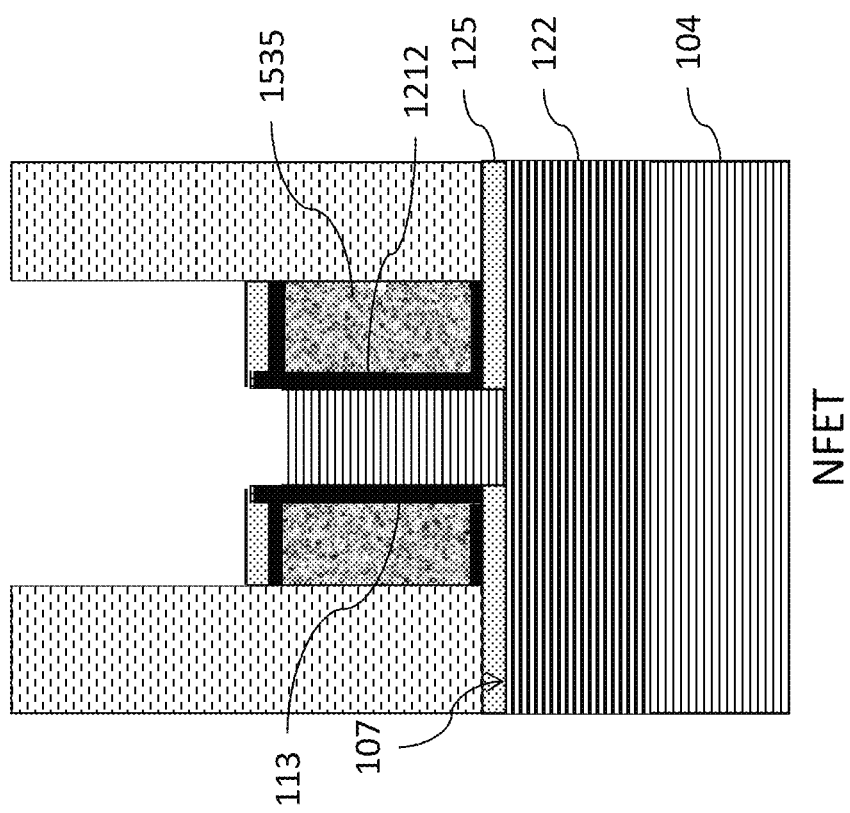
Figure 18:
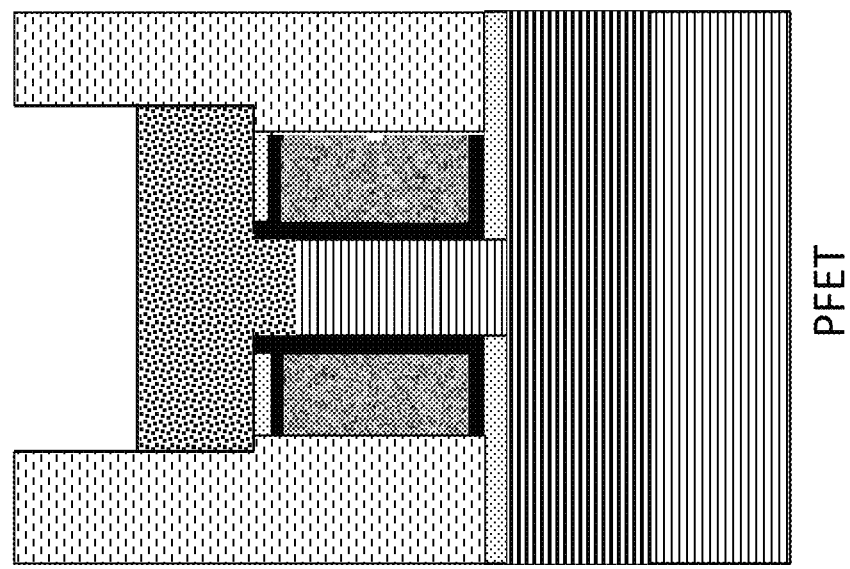
Figure 18:
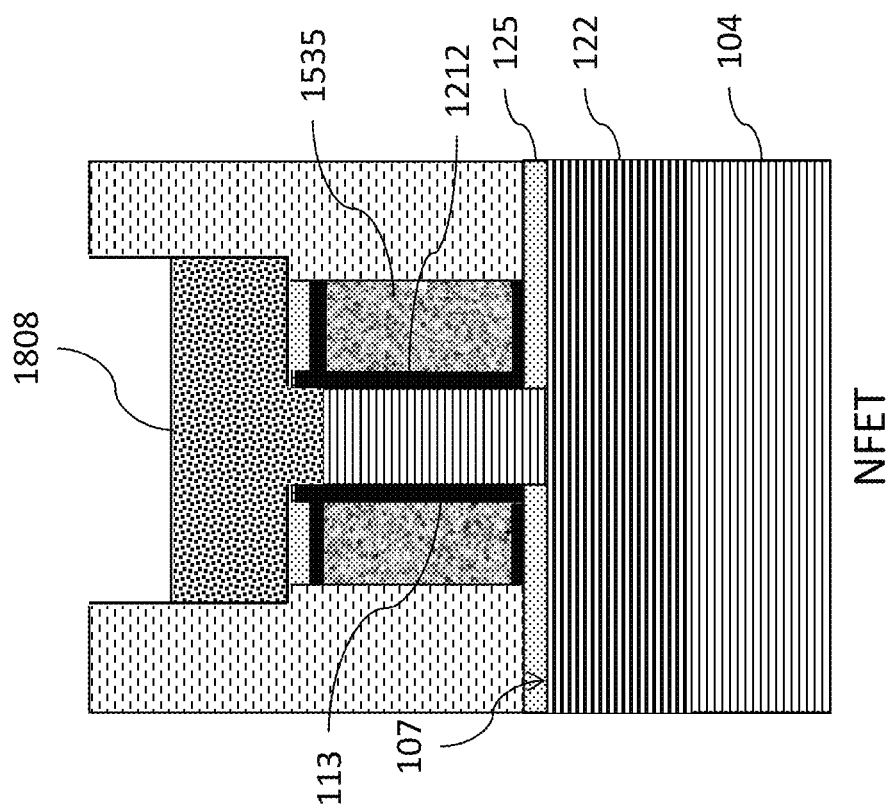

After formation of the gate electrode 1535, additional processes can be performed in order to complete the vertical FET structure. These additional processes can include, but are not limited to, formation of an upper source/drain region. As shown in FIG. 16, formation of an upper source/drain region can be performed by, for example, depositing an interlevel dielectric (ILD) layer 1616. The ILD layer 1616 can be, for example, a silicon oxide (e.g., $SiO_2$) or any other suitable ILD material (e.g., borophosphosilicate glass (BPSG), tetraethyl orthosilicate (TEOS), fluorinated tetraethyl orthosilicate (FTEOS), etc.). The ILD layer 1616 may be cleaned and polished using a CMP process. In FIG. 17, the nitride cap 909 has been etched back and an oxide cleaning performed to expose the fin 110. Then, as shown in FIG. 18, an upper source/drain region 1808 is formed in the opening (e.g., by epitaxially depositing an in situ doped semiconductor layer), as would be known by one of ordinary skill in the art.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

The method described herein enables a unique process for forming a VFET. As described above, the process resolves two issues in the fabrication process: gate length control and gate etching. This method also protects $HfO_2$ in the channel from plasma exposure.

Figure 19:
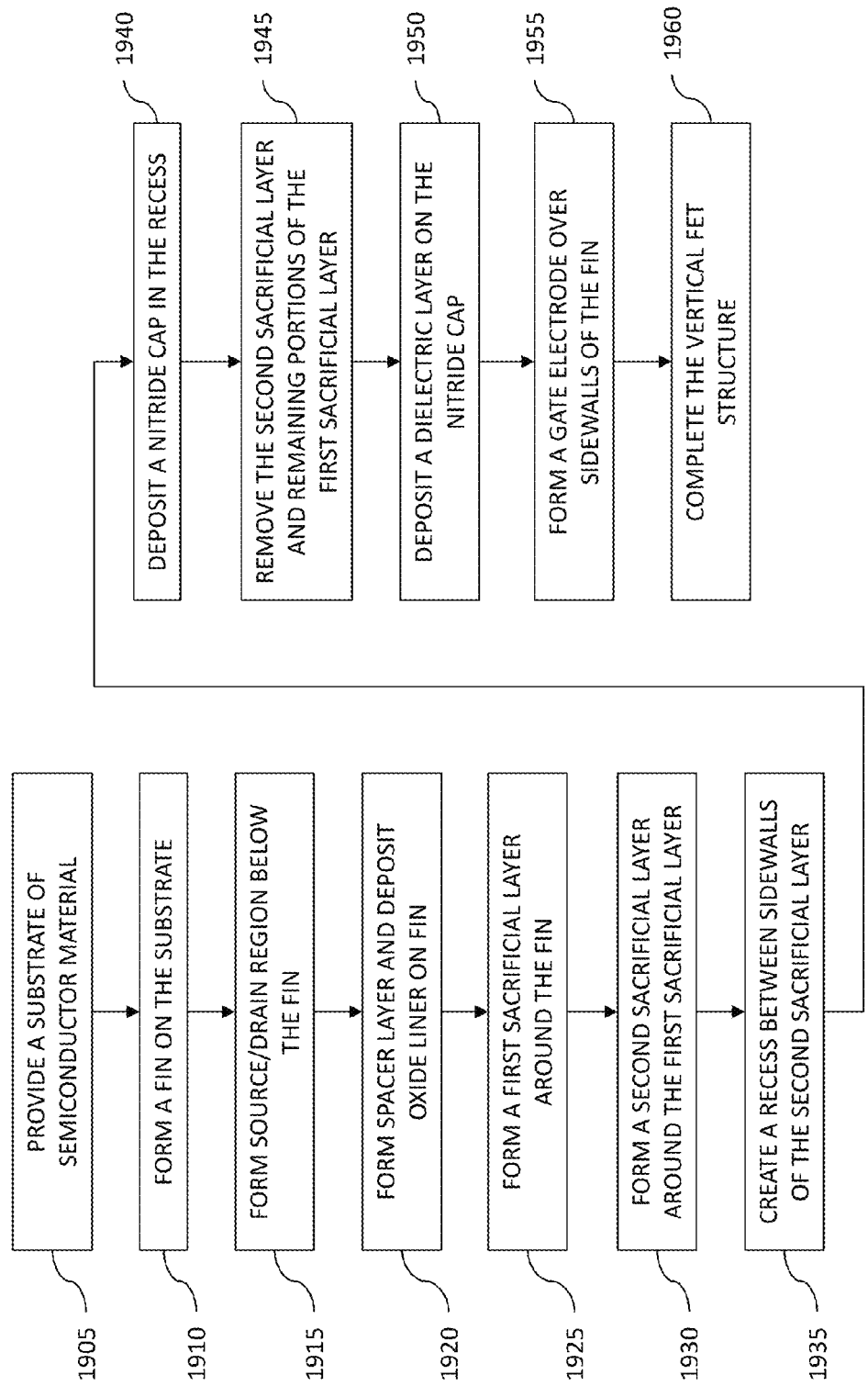
FIG. 19 is a flow diagram illustrating methods herein.

FIG. 19 illustrates a logic flowchart for fabricating a vertical transistor, according to methods herein. At 1905, a substrate of semiconductor material is provided. The substrate has a top surface. At 1910, a fin is formed on the substrate. This fin has a height above the top surface of the substrate. The fin includes a semiconductor section connected to the substrate, an oxide section above the semiconductor section, and a hardmask section above the oxide section. At 1915, a bottom source/drain region for a vertical field effect transistor (VFET) is formed below the fin. A spacer layer is formed on the top surface of the substrate and an oxide liner is deposited on the fin and the spacer layer, at 1920. At 1925, a first sacrificial layer is formed around the fin. The first sacrificial layer may be made of a conformal layer of amorphous silicon deposited on the oxide liner. At 1930, a second sacrificial layer is formed around the first sacrificial layer. The second sacrificial layer may be an oxide layer. At 1935, a portion of the first sacrificial layer is removed to create a recess between sidewalls of the second sacrificial layer. To do this, the second sacrificial layer (oxide layer) may be planarized to expose a top surface of the first sacrificial layer (conformal layer of amorphous silicon). Then, a recess is formed in the conformal layer of amorphous silicon to expose the fin, and the oxide liner on a top surface of the fin is removed. The hardmask section of the fin and exposed portions of the oxide liner are removed using an isotropic etch. The conformal layer of amorphous silicon is etched, using an isotropic etch, to a level of the oxide section of the fin. At 1940, a nitride cap is deposited on exposed portions of the conformal layer of amorphous silicon and the oxide section of the fin. At 1945, the second sacrificial layer and remaining portions of the first sacrificial layer are removed. At 1950, a dielectric layer is deposited on the nitride cap, exposed portions of the fin, and the spacer layer on the top surface of the substrate. At 1955, a gate electrode is formed over sidewalls of the fin. This may be done by depositing a work function metal (WFM) on the dielectric layer. Then, using the dielectric layer as a mask, the work function metal can be etched, after which, exposed portions of the dielectric layer are removed. At 1960, additional processes are performed in order to complete the VFET structure.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Aspects of the present disclosure are described herein with reference to flowchart illustrations and/or block diagrams of methods, apparatus (systems), and computer program products according to methods herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 20:
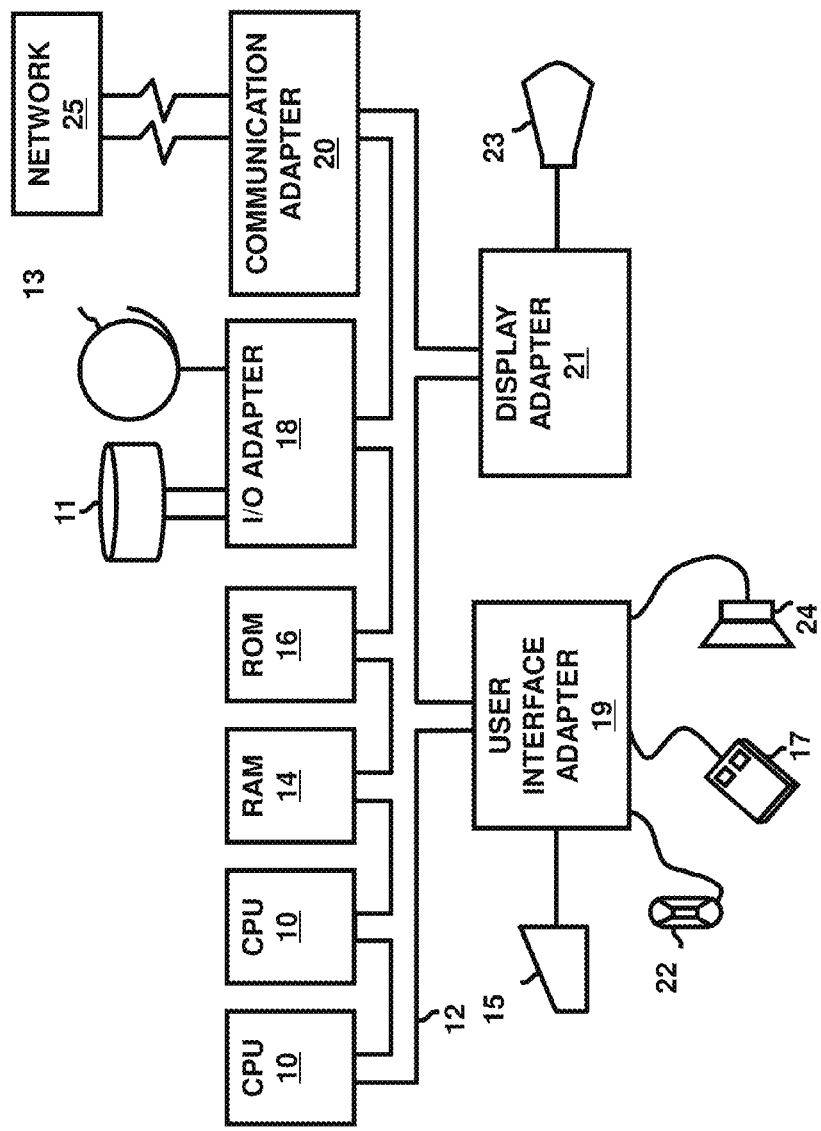
FIG. 20 is a schematic diagram illustrating an exemplary hardware system that can be used in the implementation of the design flow according to methods herein.

A representative hardware environment for implementing the methods herein is depicted in FIG. 20. This schematic drawing illustrates a hardware configuration of an information handling/computer system in accordance with the methods herein. The system includes at least one processor or central processing unit (CPU) 10. The CPUs 10 are interconnected via system bus 12 to various devices such as a Random Access Memory (RAM) 14, Read Only Memory (ROM) 16, and an Input/Output (I/O) adapter 18. The I/O adapter 18 can connect to peripheral devices, such as disk units 11 and tape drives 13, or other program storage devices that are readable by the system. The system can read the instructions on the program storage devices and follow the instructions to execute the methodology of the methods herein.

In FIG. 20, CPUs 10 perform various processing based on a program stored in a Read Only Memory (ROM) 16 or a program loaded from a peripheral device, such as disk units 11 and tape drives 13 to a Random Access Memory (RAM) 14. In the RAM 14, required data when the CPU 10 performs the various processing, or the like, is also stored, as necessary. The CPU 10, the ROM 16, and the RAM 14 are connected to one another via the system bus 12. An Input/Output adapter 18 is also connected to the system bus 12 to provide an Input/Output interface, as necessary. A removable medium, such as a magnetic disk, an optical disk, a magneto-optical disk, a semiconductor memory, or the like, may be installed on the peripheral device, as necessary, so that a computer program read therefrom may be installed into the RAM 14, as necessary.

The system further includes a user interface adapter 19 that connects a keyboard 15, mouse 17, speaker 24, microphone 22, and/or other user interface devices such as a touch screen device (not shown) to the system bus 12 to gather user input. Additionally, a communication adapter 20, including a network interface card, such as a LAN card, a modem, or the like, connects the system bus 12 to a data processing network 25. The communication adapter 20 performs communication processing via a network such as the Internet. A display adapter 21 connects the system bus 12 to a display device 23, which may be embodied as an output device such as a monitor (such as a Cathode Ray Tube (CRT), a Liquid Crystal Display (LCD), or the like), printer, or transmitter, for example.

The flowchart and block diagrams in the figures illustrate the architecture, functionality, and operation of possible implementations of systems, methods, and computer program products according to various examples disclosed herein. In this regard, each block in the flowchart or block diagrams may represent a module, segment, or portion of code, which includes one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be understood that the terminology used herein is for the purpose of describing particular examples of the disclosed structures and methods and is not intended to be limiting of this disclosure. For example, as used herein, the singular forms "a", "an", and "the" are intended to include the plural forms as well, unless the context clearly indicates otherwise. Additionally, as used herein, the terms "comprises", "comprising" "includes", and/or "including", when used in this specification, specify the presence of stated features, integers, steps, operations, elements, and/or components, but do not preclude the presence or addition of one or more other features, integers, steps, operations, elements, components, and/or groups thereof.

Furthermore, as used herein, terms such as "right", "left", "vertical", "horizontal", "top", "bottom", "upper", "lower", "under", "below", "underlying", "over", "overlying", "parallel", "perpendicular", etc., are understood to be relative locations as they are oriented and illustrated in the drawings (unless otherwise indicated). Terms such as "touching", "on", "in direct contact", "abutting", "directly adjacent to", etc., are intended to indicate that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various examples of the present disclosure have been presented for purposes of illustration, but are not intended to be exhaustive or limited to the methods disclosed. Many modifications and variations will be apparent to those of ordinary skill in the art without departing from the scope and spirit of the described examples. The terminology used herein was chosen to best explain the principles of the disclosed methods, the practical application or technical improvement over technologies found in the marketplace, or to enable others of ordinary skill in the art to understand the methods disclosed herein.

While various examples are described herein, it will be appreciated from the specification that various combinations of elements, variations, or improvements therein may be made by those skilled in the art, and are within the scope of the disclosure. In addition, many modifications may be made to adapt a particular situation or material to the teachings of the disclosed concepts without departing from the essential scope thereof. Therefore, it is intended that the concepts not be limited to the particular examples disclosed as the best mode contemplated for carrying out the methods herein, but that the methods will include all features falling within the scope of the appended claims.

What is claimed is:

1. A method of making a vertical transistor, comprising:
   forming a fin over a semiconductor substrate;
   forming a bottom source/drain region below the fin;
   forming a bottom spacer above the bottom source/drain region;
   forming a first sacrificial layer around the fin;
   forming a second sacrificial layer around the first sacrificial layer;
   removing a portion of the first sacrificial layer to create a recess between sidewalls of the second sacrificial layer;
   depositing a nitride material into the recess;
   removing the second sacrificial layer and remaining portions of the first sacrificial layer;
   depositing a dielectric layer on the nitride material and exposed portions of the fin; and
   forming a gate electrode over sidewalls of the fin.

2. The method according to claim 1, wherein the first sacrificial layer comprises a conformal layer of amorphous silicon.

3. The method according to claim 1, wherein the second sacrificial layer comprises an oxide layer.

4. The method according to claim 1, wherein the dielectric layer comprises hafnium oxide (HfO2).

5. The method according to claim 1, further comprising:
   prior to forming a first sacrificial layer around the fin, depositing an oxide liner on the fin and the bottom spacer.

6. The method according to claim 1, wherein the fin comprises a bottom semiconductor section, an oxide section above the bottom semiconductor section, and a hardmask section above the oxide section.

7. The method according to claim 6, the removing a portion of the first sacrificial layer to create a recess between sidewalls of the second sacrificial layer further comprising:
   removing the oxide section and hardmask section of the fin using an isotropic etch.

8. The method according to claim 7, further comprising:
   creating the recess between sidewalls of the second sacrificial layer using an isotropic etch of the first sacrificial layer.

9. The method according to claim 1, forming a gate electrode over sidewalls of the fin further comprising:
   depositing a work function metal on the dielectric layer;
   using the dielectric layer as a mask, etching the work function metal; and
   removing exposed portions of the dielectric layer.

10. The method according to claim 9, wherein the work function metal comprises one of titanium nitride (TiN), tantalum nitride (TaN), titanium carbide (TiC), titanium aluminide (TiAl), and tungsten (W).

11. A method, comprising:
    forming a fin on a top surface of a substrate, the fin having a height above the top surface of the substrate, the fin comprising a semiconductor section connected to the substrate, an oxide section above the semiconductor section, and a hardmask section above the oxide section, a portion of the substrate, below the fin, comprising a source/drain region for a vertical field effect transistor (VFET);
    forming a bottom spacer above the source/drain region;
    depositing an oxide liner on the fin and bottom spacer;
    forming a first sacrificial layer around the fin;
    forming a second sacrificial layer around the first sacrificial layer;
    removing the oxide section and hardmask section of the fin using an isotropic etch;
    creating a recess between sidewalls of the second sacrificial layer using an isotropic etch of the first sacrificial layer;
    depositing a nitride cap into the recess;
    removing the second sacrificial layer and remaining portions of the first sacrificial layer;
    depositing a dielectric layer on the nitride cap and exposed portions of the fin; and
    forming a gate electrode over sidewalls of the fin using a work function metal.

12. The method according to claim 11, wherein the first sacrificial layer comprises a conformal layer of amorphous silicon.

13. The method according to claim 11, wherein the second sacrificial layer comprises an oxide layer.

14. The method according to claim 11, wherein the dielectric layer comprises hafnium oxide ($HfO_2$).

15. The method according to claim 11, the forming a gate electrode over sidewalls of the fin further comprising:
    depositing a work function metal on the dielectric layer;
    using the dielectric layer as a mask, etching the work function metal; and
    removing exposed portions of the dielectric layer.

16. The method according to claim 11, wherein the gate electrode comprises one of titanium nitride (TiN), tantalum nitride (TaN), titanium carbide (TiC), titanium aluminide (TiAl), and tungsten (W).

17. A method comprising:
providing a substrate of semiconductor material, the substrate having a top surface;
forming a fin on the substrate, the fin having a height above the top surface of the substrate, the fin comprising a bottom semiconductor section, an oxide section above the bottom semiconductor section, and a hardmask section above the oxide section;
forming a spacer layer on the top surface of the substrate;
depositing an oxide liner on the fin and the spacer layer;
depositing a conformal layer of amorphous silicon on the oxide liner;
filling areas around the fin with an oxide layer;
planarizing the oxide layer to expose a top surface of the conformal layer of amorphous silicon;
forming a recess in the conformal layer of amorphous silicon to expose the fin;
removing the oxide liner on a top surface of the fin;
removing the hardmask section of the fin;
removing exposed portions of the oxide liner;
etching exposed portions of amorphous silicon;
depositing a nitride cap on exposed portions of the conformal layer of amorphous silicon and the oxide section of the fin;
removing the oxide layer;
removing the conformal layer of amorphous silicon and remaining portions of the oxide liner on the fin;
depositing a dielectric layer on the nitride cap, exposed portions of the fin, and the spacer layer on the top surface of the substrate;
depositing a work function metal on the dielectric layer;
using the dielectric layer as a mask, etching the work function metal; and
removing exposed portions of the dielectric layer.

18. The method according to claim 17, wherein a portion of the substrate, below the fin, comprises a source/drain region for a vertical field effect transistor (VFET).

19. The method according to claim 17, wherein the dielectric layer comprises hafnium oxide (HfO2).

20. The method according to claim 17, wherein the etching exposed portions of amorphous silicon comprises using an isotropic etching process.

* * * * *